United States Patent
Onoue (12)

(10) Patent No.: US 6,233,701 B1
(45) Date of Patent: May 15, 2001

(54) METHOD AND APPARATUS FOR TEST PROGRAM EXECUTION CONTROL, AND A COMPUTER-READABLE RECORDING MEDIUM WITH A PROGRAM FOR MAKING A COMPUTER EXECUTE THE METHOD RECORDED THEREIN

(75) Inventor: Kunihito Onoue, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/161,029

(22) Filed: Sep. 25, 1998

(30) Foreign Application Priority Data

Apr. 23, 1998 (JP) .................................................. 10-113767

(51) Int. Cl.⁷ .................................................. G06F 11/263

(52) U.S. Cl. .............................................. 714/33; 714/738

(58) Field of Search ................................. 714/33, 738, 30, 714/31, 32, 37, 38, 41, 47, 703, 704, 741; 703/22; 716/4; 717/4

(56) References Cited

FOREIGN PATENT DOCUMENTS

| 402226078 | * | 9/1990 | (JP) | ................................. G01R/31/28 |
| 406265596 | * | 9/1994 | (JP) | ................................. G01R/31/28 |

* cited by examiner

Primary Examiner—Robert Beausoleil
Assistant Examiner—Scott Baderman
(74) Attorney, Agent, or Firm—Greer, Burns & Crain, Ltd.

(57) ABSTRACT

A test program execution control apparatus, in which an operation of testing is started according to controls by a test program execution control section, a period of editing data for test results to a test editing section is specified by an editing period input section, the data for test results within the editing period is edited by a test result editing section, an order of execution of testing for test items to be executed as a test program and whether testing is executed or not are decided from the results of editing by a test item scheduling section, a test-item execution table is prepared depending on the order of execution of testing for the decided test items as well as on the condition as to whether testing thereto is executed or not, and the test program is discretely executed for each test item according to the contents of the test-item execution table.

15 Claims, 13 Drawing Sheets

FIG.4

INPUT SCREEN FOR EDITING PERIOD/ EXECUTION CONDITION   DATE : 15. 09. 1997

EDITING PERIOD OF DATA SPECIFIED

- ☐ IN THE PAST _____ YEAR(S)
- ☐ IN THE PAST _____ MONTH(S)
- ☐ IN THE PAST _____ DAYS
- ☐ __MONTH__DATE__YEAR ~ __MONTH__DATE__YEAR

201

EXECUTION CONDITION FOR TESTING SPECIFIED

- ☐ IN ORDER FROM AN ITEM HAVING THE HIGHEST ERROR OCCURRENCE FREQUENCY
- ☐ IN ORDER FROM AN ITEM HAVING AN ERROR OCCURRING AT THE SHORTEST INTERVAL
- ☐ IN ORDER FROM AN ITEM HAVING THE MOST RECENT ERROR

202

DETAILED CONDITION SPECIFIED

- ☐ FREQUENCY OF ___% OR LESS : NOT EXECUTED
- ☐ INTERVAL OF ___ DAYS OR MORE : NOT EXECUTED
- ☐ ___ DAYS BEFORE OR MORE : NOT EXECUTED

INPUT SCREEN FOR EDITING PERIOD/EXECUTION CONDITION

DATE : 15. 09. 1997

EDITING PERIOD OF DATA SPECIFIED

- ☐ IN THE PAST _____ YEAR(S)
- ■ IN THE PAST __6__ MONTH(S)
- ☐ IN THE PAST _____ DAYS
- ☐ __MONTH __DATE __YEAR ~ __MONTH __DATE __YEAR

201

EXECUTION CONDITION FOR TESTING SPECIFIED

- ■ IN ORDER FROM AN ITEM HAVING THE HIGHEST ERROR OCCURRENCE FREQUENCY
- ☐ IN ORDER FROM AN ITEM HAVING AN ERROR OCCURRING AT THE SHORTEST INTERVAL
- ☐ IN ORDER FROM AN ITEM HAVING THE MOST RECENT ERROR

202

DETAILED CONDITION SPECIFIED

- ■ FREQUENCY OF _10_ % OR LESS : NOT EXECUTED
- ☐ INTERVAL OF ____ DAYS OR MORE : NOT EXECUTED
- ☐ ____ DAYS BEFORE OR MORE : NOT EXECUTED

| TEST ITEM | EXECUTED DATE | RESULT OF EXECUTION |
|---|---|---|
| TEST ITEM 1 | 1995/01/12 | OK |
| | 1995/01/19 | OK |
| | 1995/01/26 | NG |
| | ⋮ | ⋮ |
| | 1997/09/01 | OK |
| | 1997/09/08 | NG |
| TEST ITEM 2 | 1995/01/12 | OK |
| | 1995/01/19 | OK |
| | 1995/01/26 | OK |
| | ⋮ | ⋮ |
| | 1997/09/01 | NG |
| | 1997/09/08 | OK |
| ⋮ | ⋮ | ⋮ |
| TEST ITEM 10 | 1995/01/12 | NG |
| | 1995/01/19 | OK |
| | 1995/01/26 | OK |
| | ⋮ | ⋮ |
| | 1997/09/01 | OK |
| | 1997/09/08 | OK |

FIG.7A

| TEST ITEM | OCCURRENCE FREQUENCY |
|---|---|
| TEST ITEM 1 | 16.0% |
| TEST ITEM 2 | 20.0% |
| TEST ITEM 3 | 4.0% |
| TEST ITEM 4 | 12.0% |
| TEST ITEM 5 | 28.0% |
| TEST ITEM 6 | 12.0% |
| TEST ITEM 7 | 8.0% |
| TEST ITEM 8 | 24.0% |
| TEST ITEM 9 | 0.0% |
| TEST ITEM 10 | 8.0% |

FIG.7B

| TEST ITEM | SHORTEST ERROR-OCCURRENCE INTERVAL |
|---|---|
| TEST ITEM 1 | 21 DAYS |
| TEST ITEM 2 | 7 DAYS |
| TEST ITEM 3 | 180 DAYS |
| TEST ITEM 4 | 14 DAYS |
| TEST ITEM 5 | 28 DAYS |
| TEST ITEM 6 | 70 DAYS |
| TEST ITEM 7 | 105 DAYS |
| TEST ITEM 8 | 35 DAYS |
| TEST ITEM 9 | 180 DAYS |
| TEST ITEM 10 | 126 DAYS |

FIG.7C

| TEST ITEM | DATE OF THE LAST ERROR |
|---|---|
| TEST ITEM 1 | 1997/09/08 |
| TEST ITEM 2 | 1997/09/01 |
| TEST ITEM 3 | 1997/05/12 |
| TEST ITEM 4 | 1997/08/04 |
| TEST ITEM 5 | 1997/08/18 |
| TEST ITEM 6 | 1997/07/14 |
| TEST ITEM 7 | 1997/06/30 |
| TEST ITEM 8 | 1997/07/07 |
| TEST ITEM 9 | 1997/03/15 |
| TEST ITEM 10 | 1997/07/28 |

FIG.8

| ORDER | TEST ITEM | OCCURRENCE FREQUENCY |
|---|---|---|
| 1 | TEST ITEM 5 | 28.0% |
| 2 | TEST ITEM 8 | 24.0% |
| 3 | TEST ITEM 2 | 20.0% |
| 4 | TEST ITEM 1 | 16.0% |
| 5 | TEST ITEM 4 | 12.0% |
| 6 | TEST ITEM 6 | 12.0% |
| 7 | TEST ITEM 7 | 8.0% |
| 8 | TEST ITEM 10 | 8.0% |
| 9 | TEST ITEM 3 | 4.0% |
| 10 | TEST ITEM 9 | 0.0% |

FIG.9

| ORDER | TEST ITEM | OCCURRENCE FREQUENCY |
|---|---|---|
| 1 | TEST ITEM 5 | 28.0% |
| 2 | TEST ITEM 8 | 24.0% |
| 3 | TEST ITEM 2 | 20.0% |
| 4 | TEST ITEM 1 | 16.0% |
| 5 | TEST ITEM 4 | 12.0% |
| 6 | TEST ITEM 6 | 12.0% |

FIG.10

| TEST ITEM | EXECUTED DATE | RESULT OF EXECUTION |
|---|---|---|
| TEST ITEM 1 | 1997/09/15 | OK |
| TEST ITEM 2 | 1997/09/15 | NG |
| TEST ITEM 3 | 1997/09/15 | OK |
| TEST ITEM 4 | 1997/09/15 | OK |
| TEST ITEM 5 | 1997/09/15 | OK |
| TEST ITEM 6 | 1997/09/15 | NG |
| TEST ITEM 7 | 1997/09/15 | OK |
| TEST ITEM 8 | 1997/09/15 | OK |
| TEST ITEM 9 | 1997/09/15 | OK |
| TEST ITEM 10 | 1997/09/15 | OK |

FIG.11

INPUT SCREEN FOR EDITING PERIOD/EXECUTION CONDITION

DATE : 15. 09. 1997

EDITING PERIOD OF DATA SPECIFIED

- ☐ IN THE PAST ____YEAR(S)
- ■ IN THE PAST __6__MONTH(S)
- ☐ IN THE PAST ____DAYS
- ☐ __MONTH__DATE__YEAR ~ __MONTH__DATE__YEAR

EXECUTION CONDITION FOR TESTING SPECIFIED

- ☐ IN ORDER FROM AN ITEM HAVING THE HIGHEST ERROR OCCURRENCE FREQUENCY
- ■ IN ORDER FROM AN ITEM HAVING AN ERROR OCCURRING AT THE SHORTEST INTERVAL
- ☐ IN ORDER FROM AN ITEM HAVING THE MOST RECENT ERROR

DETAILED CONDITION SPECIFIED

- ☐ FREQUENCY OF ____% OR LESS : NOT EXECUTED
- ■ INTERVAL OF 150 DAYS OR MORE : NOT EXECUTED
- ☐ ____DAYS BEFORE OR MORE : NOT EXECUTED

FIG.12

| ORDER | TEST ITEM | OCCURRENCE FREQUENCY |
|-------|-----------|----------------------|
| 1 | TEST ITEM 2 | 7 DAYS |
| 2 | TEST ITEM 4 | 14 DAYS |
| 3 | TEST ITEM 1 | 21 DAYS |
| 4 | TEST ITEM 5 | 28 DAYS |
| 5 | TEST ITEM 8 | 35 DAYS |
| 6 | TEST ITEM 6 | 70 DAYS |
| 7 | TEST ITEM 7 | 105 DAYS |
| 8 | TEST ITEM 10 | 126 DAYS |
| 9 | TEST ITEM 3 | 180 DAYS |
| 10 | TEST ITEM 9 | 180 DAYS |

FIG.13

```
                                                                    20
┌──────────────────────────────────────────────────────────────────┐
│  ┌─────────────────────────┐                                     │
│  │ INPUT SCREEN FOR EDITING PERIOD/ │       DATE : 15. 09. 1997  │
│  │      EXECUTION CONDITION         │                            │
│  └─────────────────────────┘                                     │
│     ┌──────────────────┐                                         │
│     │ EDITING PERIOD OF │                                        │
│     │  DATA SPECIFIED   │                                        │
│     └──────────────────┘                                         │
│     ┌─ ─ ─ ─ ─ ─ ─ ─ ─ ─ ─ ─ ─ ─ ─ ─ ─ ─ ─ ─ ─ ─ ─ ─ ─ ─ ┐       │
│     │   ☐   IN THE PAST  ____YEAR(S)                     │  201  │
│     │   ■   IN THE PAST    6  MONTH(S)                   │       │
│     │   ☐   IN THE PAST  ____DAYS                        │       │
│     │   ☐  __MONTH__DATE__YEAR ~ __MONTH__DATE__YEAR     │       │
│     └─ ─ ─ ─ ─ ─ ─ ─ ─ ─ ─ ─ ─ ─ ─ ─ ─ ─ ─ ─ ─ ─ ─ ─ ─ ─ ┘       │
│     ┌──────────────────┐     ┌──────────────────┐                │
│     │EXECUTION CONDITION│     │ DETAILED CONDITION│              │
│     │ FOR TESTING SPECIFIED│  │    SPECIFIED      │              │
│     └──────────────────┘     └──────────────────┘                │
│   ┌─ ─ ─ ─ ─ ─ ─ ─ ─ ─ ─ ─ ┐ ┌─ ─ ─ ─ ─ ─ ─ ─ ─ ─ ─ ─ ┐          │
│   │☐ IN ORDER FROM AN ITEM HAVING│ │☐ FREQUENCY OF __% OR LESS: │ │
│   │  THE HIGHEST ERROR           │ │  NOT EXECUTED              │ │
│   │  OCCURRENCE FREQUENCY        │ │                            │ │
│   │☐ IN ORDER FROM AN ITEM HAVING│ │☐ INTERVAL OF __DAYS OR MORE:│ │
│   │  AN ERROR OCCURRING AT THE   │ │  NOT EXECUTED              │ │
│   │  SHORTEST INTERVAL           │ │                            │ │
│   │■ IN ORDER FROM AN ITEM HAVING│ │■ 180 DAYS BEFORE OR MORE : │ │
│   │  THE MOST RECENT ERROR       │ │  NOT EXECUTED              │ │
│   └─ ─ ─ ─ ─ ─ ─ ─ ─ ─ ─ ─ ┘ └─ ─ ─ ─ ─ ─ ─ ─ ─ ─ ─ ─ ┘          │
│                          202                       203           │
└──────────────────────────────────────────────────────────────────┘
```

FIG.14

| ORDER | TEST ITEM | DATE OF THE LAST ERROR |
|---|---|---|
| 1 | TEST ITEM 1 | 1997/09/08 |
| 2 | TEST ITEM 2 | 1997/09/01 |
| 3 | TEST ITEM 5 | 1997/08/18 |
| 4 | TEST ITEM 4 | 1997/08/04 |
| 5 | TEST ITEM 10 | 1997/07/28 |
| 6 | TEST ITEM 6 | 1997/07/14 |
| 7 | TEST ITEM 9 | 1997/07/07 |
| 8 | TEST ITEM 7 | 1997/06/30 |
| 9 | TEST ITEM 3 | 1997/05/12 |

FIG.15

| ORDER | TEST ITEM | OCCURRENCE FREQUENCY | EXECUTED TIME |
|---|---|---|---|
| 1 | TEST ITEM 5 | 28.0% | 6 TIMES |
| 2 | TEST ITEM 8 | 24.0% | 5 TIMES |
| 3 | TEST ITEM 2 | 20.0% | 5 TIMES |
| 4 | TEST ITEM 1 | 16.0% | 4 TIMES |
| 5 | TEST ITEM 4 | 12.0% | 3 TIMES |
| 6 | TEST ITEM 6 | 12.0% | 3 TIMES |
| 7 | TEST ITEM 7 | 8.0% | 2 TIMES |
| 8 | TEST ITEM 10 | 8.0% | 2 TIMES |
| 9 | TEST ITEM 3 | 4.0% | 1 TIMES |
| 10 | TEST ITEM 9 | 0.0% | 1 TIMES |

FIG.16

| ORDER | TEST ITEM | OCCURRENCE FREQUENCY | EXECUTED TIME |
|---|---|---|---|
| 1 | TEST ITEM 5 | 28.0% | 4 TIMES |
| 2 | TEST ITEM 8 | 24.0% | 3 TIMES |
| 3 | TEST ITEM 2 | 20.0% | 3 TIMES |
| 4 | TEST ITEM 1 | 16.0% | 2 TIMES |
| 5 | TEST ITEM 4 | 12.0% | 1 TIMES |
| 6 | TEST ITEM 6 | 12.0% | 1 TIMES |

METHOD AND APPARATUS FOR TEST PROGRAM EXECUTION CONTROL, AND A COMPUTER-READABLE RECORDING MEDIUM WITH A PROGRAM FOR MAKING A COMPUTER EXECUTE THE METHOD RECORDED THEREIN

FIELD OF THE INVENTION

The present invention relates to a method and apparatus for controlling execution of testing for an information processing system and a computer-readable recording medium with a program for making a computer execute the method recorded therein.

BACKGROUND OF THE INVENTION

There has been described a "Test controlling method for an information processing system" in Japanese Patent Laid-Open Publication No. HEI 3-257538 as a method for enhancing the accuracy of a programming test in the information processing system. In this method, error factors for each test item from a result of tests are stored each time when the test is executed, an error rate for each error factor is obtained based on the error factor for each of the test items, a test item relating to execution of an error factor with a high error rate is detected, and testing for this test item is preferentially executed.

The conventional type of test program execution control apparatus as disclosed in the publication obtains an error rate from a test result obtained by collecting a number of execution times of test items and times of occurrence of error in the past, and preferentially executes the test item having a high error rate or increases the number of executions for the test item having a high error rate. Because of this, a tendency of errors varying in association with elapse of time is not reflected to control over execution of testing at a current point of time, and for this reason efficient testing appropriate for the current condition can not be executed.

Errors occurring in an information processing system vary in association with elapse of operating time. For example, in a case of software such as a firmware or a driver, although various types of errors arise at the time of starting the system operation, the software is stabilized in its quality in association with elapse of time, and occurrence of errors decreases. In contrast, in a case of hardware such as I/O or the like, it is anticipated that the error goes on increasing due to abrasion or dust with time. When a device in which error occurs many times is replaced with a device newly designed for having dealt with the errors, sometimes the errors may not occur at all.

As described in the above technology, if the method of preferentially executing testing for a test item having a high error rate in the past test result data is only employed, test efficiency may decrease because a test item currently having a low error rate may be preferentially executed or number of execution of testing for the test item may be unnecessarily increased.

If a test controlling method in which testing for a test item with a low error rate in the past test result data is not executed is employed, the error rate is reduced on the whole, but a test item in which an error is frequently occurring recently may not be executed, and there may arise a case in which an error that should have been detected is not detected at all.

SUMMARY OF THE INVENTION

It is an object of the present invention to provide, for the purpose of solving the problems as described above, a method and apparatus for executing efficient testing appropriate for the current condition of an information processing system from the errors occurred in the past testing and a computer-readable recording medium with a program for making a computer execute the method recorded therein.

In the invention, a result of testing for each test item for a test program executed for a specified information processing system is accumulated along with the test schedule, and, of the test results, an operating condition of the information processing system is determined based on the results of testing during only an arbitrary test period. Because of which, operating conditions for the arbitrary test period, namely at an arbitrary point of time during the test period can be acquired for in for the information processing system, and with this feature, efficient testing appropriate to the current condition of the information processing system can be realized.

In the invention, a number of times the testing for each test item is to be executed is determined according to a frequency of occurrence of errors, so that effective testing focusing on a critical function can be realized within a limited period of time.

In the invention, a condition in which an error occurs for each test item is determined, and an order of execution is decided in an order from a test item corresponding to the highest frequency of occurrence of errors to a test item corresponding to the lowest frequency of occurrence of errors according to the condition of occurrence of errors for each test item. Because of which testing from a test item having higher probability of detecting errors can efficiently be executed under the present condition of the information processing system.

In the invention, a condition in which an error occurs for each test item is determined as an, and an order of execution is decided in an order from a test item in which error occurs at a shortest interval to a test item in which error occurs at a longest interval according to the condition of occurrence of errors for each test item. Because of which, testing from a test item in which an error easily occurs can efficiently be realized.

In the invention, a condition in which an error occurs for each test item is determined as an operating condition, and an order of execution is decided in an order from a test item in which an error has occurred most recently to a test item in which an error has occurred most lately according to the condition of occurrence of errors for each test item. Because of which, it is possible to first recognize that the error having occurred is accurately dealt with.

In the invention, a condition in which an error occurs for each test item is determined, and a test item having a lower value of error occurrence frequency than a preset value is excluded from objects for execution according to the condition of occurrence of errors for each test item. Because of which, testing can efficiently be executed within a shorter period of time without substantially lowering the effect due to the test.

In the invention, a condition in which an error occurs for each test item is determined, and an order of execution is decided in a descending order from a test item corresponding to the highest error occurrence frequency or in an ascending order from a test item corresponding to an error occurring at the shortest interval, or in an ascending order from a test item corresponding to the last error according to the condition of occurrence of errors for each test item. Because of which, testing from a test item having higher probability of detecting errors can efficiently be executed when attention is paid to test items having a higher frequency of occurrence of errors, or testing from a test item having higher probability of occurrence of a errors when attention is paid to test items corresponding to an error occurring at a short interval, and checking whether countermeasures have been taken or not when attention is paid to the most recent occurrence of error becomes possible.

In the invention, there are provided steps of accumulating a result of testing for each test item for a test program executed for a specified information processing system along with the test schedule in the memory, specifying an arbitrary test period within the test schedule for each test item accumulated in the memory, determining operating condition of the information processing system based on the results of testing during the arbitrary test period, and deciding an order of execution of testing for each test item for the test program according to the determined operating condition, so that an operating condition for the arbitrary test period, namely at an arbitrary point time during the test period can be acquired for the information processing system. With this feature, efficient testing appropriate for a current condition of the information processing system can be realized.

In the invention, there are provided steps of determining of the conditions in which an error occurs for each test item, and deciding an order of execution in a descending order from a test item corresponding to the highest error occurrence frequency or in an ascending order from a test item corresponding to an error occurring at the shortest interval or in an ascending order from a test item corresponding to the last error according to the condition of occurrence of errors for each test item. Because of which, testing can efficiently be started from a test item having higher probability of detecting errors when attention is paid to test item having a higher frequency of occurrence of errors, or testing from a test item having higher probability of occurrence of error when attention is paid to tests item corresponding to an error occurring at a short interval, and checking whether countermeasures have been taken or not when attention is paid to the most recent occurrence of error becomes possible.

In the invention, there are provided steps of determining of the condition in which an error occurs for each test item, and excluding a test item having a lower value of error occurrence frequency than a preset value from objects for execution. Because of which, testing can efficiently be executed within a shorter period of time without substantially lowering due to the test effect.

In the invention, there are provided steps of determining the conditions in which an error occurs for each test item, and deciding an order of execution of testing in a descending order from a test item corresponding to the highest error occurrence frequency, or in an ascending order from a test item corresponding to an error occurring at the shortest interval, or in an ascending order from a test item corresponding to the last error according to the condition of occurrence of errors for each test item. Because of which, testing can efficiently be started from a test item having higher probability of detecting errors when attention is paid to test item having a higher frequency of occurrence of errors, or testing from a test item having higher probability of occurrence of error when attention is paid to test item corresponding to an error occurring at a short interval, and checking whether countermeasures have been taken or not when attention is paid to the most recent occurrence of error becomes possible.

In the invention, a number of executions of testing for each test item is set according to the error occurrence frequency, so that effective testing focusing on a critical function can be realized within a limited period of time.

In the invention, there is provided a recording medium in which is recorded a method having steps of accumulating a test result for each test item for a test program executed for a specified information processing system along with the test schedule in a memory, specifying an arbitrary test period within the test schedule for each test item accumulated in the memory, determining operating condition of the information processing system based on the results of testing during the arbitrary test period, and deciding an order of execution of testing for test items for the test program according to the determined operating condition, so that a function of acquiring an operating condition for the arbitrary test period, namely at an arbitrary point of time during the test period can be acquired for the specified information processing system for the test program execution control apparatus. With this feature, efficient testing appropriate for a current condition of the information processing system can be realized.

In the invention, there is provided a recording medium in which is recorded a method having steps of determining of the condition in which an error occurs for each test item, and deciding an order of execution of testing in a descending order from a test item corresponding to the highest error occurrence frequency, or in an ascending order form a test item corresponding to an error occurring at the shortest interval, or in an ascending order form a test item corresponding to the last error according to the condition of occurrence of errors for each test item. Because of which, in the test program execution control apparatus, testing can efficiently be started from a test item having higher probability of detecting errors in an information processing system when attention is paid to test item having a higher frequency of occurrence of errors, or testing from a test item having higher probability of occurrence of error when attention is paid to test item corresponding to an error occurring at a short interval, and checking whether countermeasures have been taken or not when attention is paid to the most recent occurrence error becomes possible.

In the invention, there is provided a recording medium in which is recorded a method having steps of determining of the condition in which an error occurs for each test item, and excluding a test item having a lower value of error occurrence frequency than a preset value from objects for execution according to the condition of occurrence of errors for each test item. Because of which, in the test program execution control apparatus, testing can efficiently be executed within a shorter period without substantially lowering the effect of the test.

Other objects and features of this invention will become clear from the following description with reference to the accompanying drawings.

BRIEF DESCRIPTION OF THE DRAWINGS

FIG. 4 is a view showing an example of an input screen during an editing period;

FIG. 5 is a view showing an example of the input of editing period;

FIG. 6 is a view for explaining an example of test results;

FIGS. 7A to 7C are views for explaining an example of edit results;

FIG. 8 is a view for explaining an example of contents of a test-item execution table corresponding to an editing period as well as to conditions for execution control;

FIG. 9 is a view for explaining an example of contents of a test-item execution table different from that shown in FIG. 8;

FIG. 10 is a view for explaining an example of updated test results;

FIG. 11 is a view showing another example of input of the editing period;

FIG. 12 is a view for explaining another example of contents of the test-item execution table corresponding to an editing period as well as to conditions for execution control;

FIG. 13 is a view showing still another example of input of the editing period;

FIG. 14 is a view for explaining still another example of contents of the test-item execution table corresponding to an editing period as well as to conditions for execution control;

FIG. 15 is a view for explaining an example of contents of the test-item execution table corresponding to an editing period as well as to conditions for execution control; and FIG. 16 is a view for explaining an example of contents of the test-item execution table different from that shown in FIG. 15.

DESCRIPTION OF THE PREFERRED EMBODIMENTS

Detailed description is made for preferred embodiments of a test program execution control apparatus, a test program execution controlling method, and a computer-readable recording medium with a program for making a computer execute the method recorded therein with reference to the related drawings.

Figure 1:
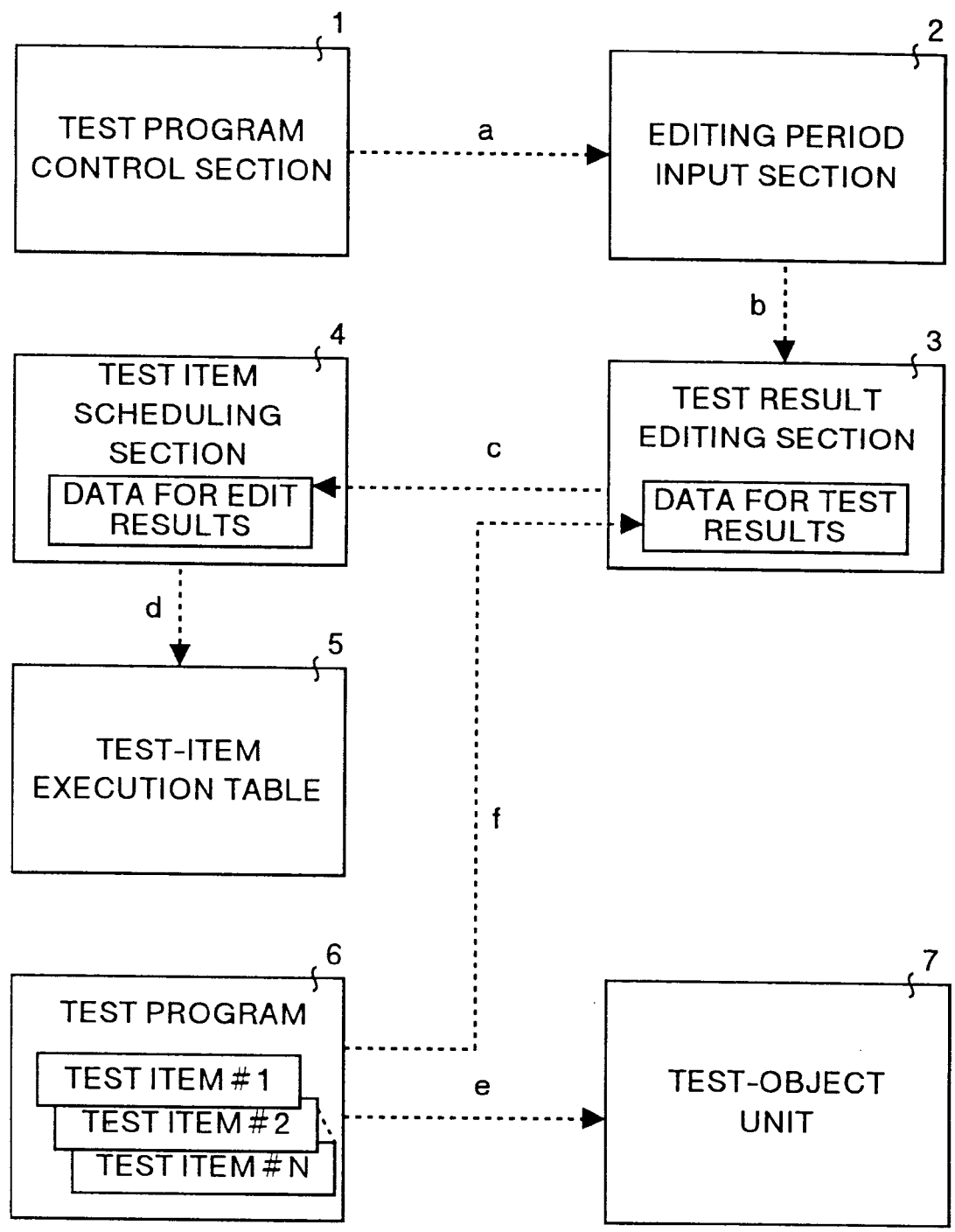
FIG. 1 is a block diagram functionally showing a test program execution control apparatus according to one embodiment of the present invention.

Description is made for principles of an embodiment of the present invention. FIG. 1 is a block diagram functionally showing a test program execution control apparatus according to an embodiment of the present invention. The test program execution control apparatus shown in the figure is a central section that controls the entire apparatus, and comprises a test program control section 1 for controlling execution of testing for each test item, an editing period input section 2 for specifying an editing period and a conditions for execution control for data on test results for each test item through operation by an operator, a test result editing section 3 for analyzing data for test results during the editing period inputted in the editing period input section 2 concerning how errors occur in the data for test results accumulated until the present time, a test item scheduling section 4 for deciding an order of execution of testing for test items and whether testing should be executed or not based on the data on results of analysis in the test result editing section 3, a test-item execution table 5 prepared in the test item scheduling section 4, and a test program 6 comprising a plurality of test items #1 to #N (N: a natural number) each of which is independent from the others. This test program execution control apparatus is connected to a test-object unit 7 as an object for execution of testing.

Detailed description is made herein for the editing period input section 2. In a case where the date of the test is, for example, Sep. 15, 1997, input of an editing period such as "past three months", "past six months", "past hundred days", or "from Jan. 1, 1997 to Sep. 14, 1997" is accepted. When accepting input of an editing period, the input is accepted, for instance, by displaying selection items for the editing periods on a display unit such as CRT and prompting an operator to make a choice.

Also accepted are conditions for execution control such as "Executed from a test item having the highest frequency of occurrence of errors", "Execute testing from a test item having an error occurring at the shortest interval", "Execute testing from a test item in which an error was detected most recently", and "Execute from a test item having the highest frequency of occurrence of errors, but a test item having the frequency of occurrence of an error is less than 5% is not to be executed". Also when accepting any of these conditions, an input of the condition for execution control is accepted for instance by displaying the selection items for the conditions on a display unit such as CRT and prompting an operator to make a choice.

Description is made for operations based on the principle described above. At first, the test program 6 is executed with respect to the test-object unit 7 according to controls by the test program control section 1. Result and date of the test are correlated to each other and stored in the test result editing section 3 as data for test results (indicated by the arrow f in FIG. 1). On the other hand, editing period and conditions for execution control are inputted by an operator through the editing period input section 2 according to controls by the test program control section 1 (indicated by the arrow a in FIG. 1).

Input of this editing period can be accepted for instance by displaying selection items for the editing period on a display unit or the like. The condition for execution control herein indicates a condition for deciding an order of execution from a test item corresponding to the highest frequency of occurrence of errors to a test item corresponding to the lowest frequency of occurrence of errors (hereafter descending order from a test item corresponding to the highest frequency of occurrence of errors) a condition for deciding an order of execution from a test item in which error occurs at the shortest interval to a test item in which error occurs at the longest interval (hereafter ascending order from a test item corresponding to an error occurring at the shortest interval) a condition for deciding an order of execution from a test item in which error has occurred most recently to a test item in which error has occurred most lately (hereafter ascending order from a test item corresponding to the last error) and a condition for excluding a test item having a lower value of error occurrence frequency than a preset value from objects for execution or the like.

The editing period inputted by the operator is notified to the test result editing section 3 from the editing period input section 2 (indicated by the arrow b in FIG. 1). The test result editing section 3 extracts data for test results having the test period corresponding to the editing period notified from the editing period input section 2, and edits the data for the test results. Editing indicates herein an operation for analyzing a condition of occurrence of errors. The data obtained through this editing operation, namely the data for results of editing is notified to the test item scheduling section 4 (indicated by the arrow c in FIG. 1). The test item scheduling section 4 decides an order of the test items and whether testing should be executed or not from the notified data for edit results, and prepares the test-item execution table 5 according to the decided information (indicated by the arrow d in FIG. 1).

In this step, the test program control section 1 provides controls for execution to the test-object unit 7 according to the order of test item in the test program 6 registered in the test-item execution table 5 and the decision as to whether testing should be executed or not (indicated by the arrow e in FIG. 1). The results of the test are additionally accumulated in the test result editing section 3 as data for test results (indicated by the arrow f in FIG. 1).

By analyzing the data for errors having occurred in the past arbitrarily period, efficient tests appropriate for a current condition of the test-object unit 7 are executed.

Figure 2:
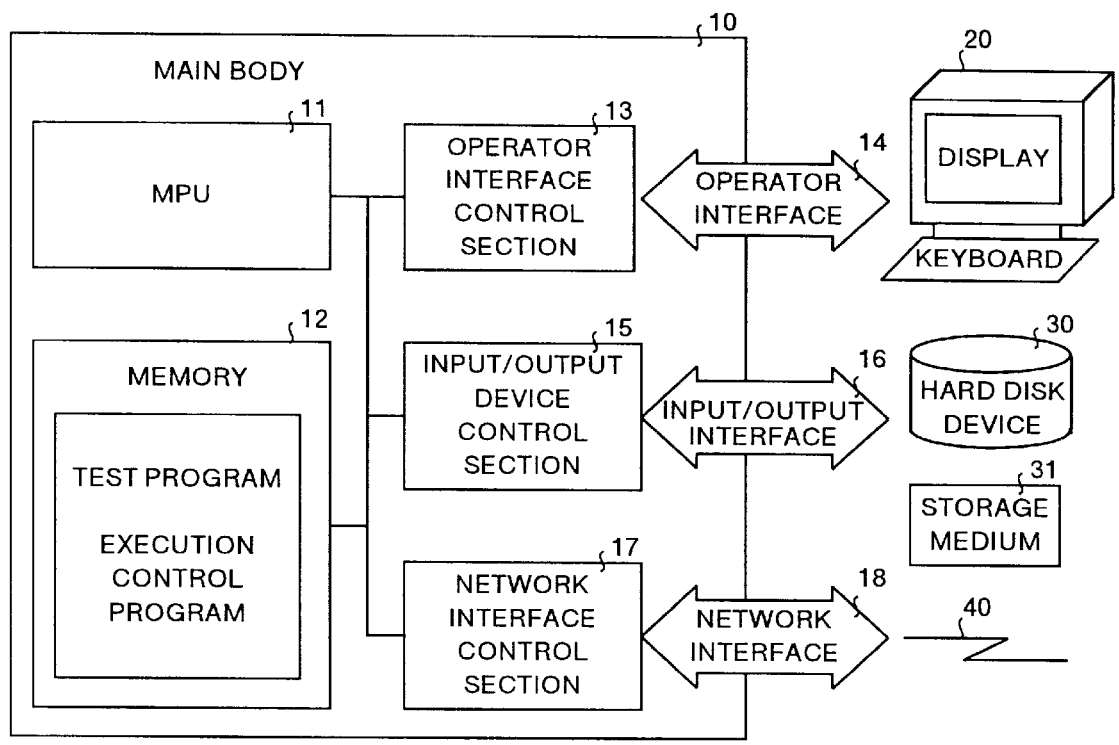
FIG. 2 is a block diagram showing software of the test program execution control apparatus according to one embodiment of the present invention.

Description is made for a case where the functional configuration is realized with hardware. FIG. 2 is a block diagram showing software of the test program execution control apparatus according to one embodiment of the present invention. The test program execution control apparatus shown in the figure comprises a main body to performing all the functions shown in FIG. 1, a display/keyboard 20 corresponding to a portion of the editing period input section 2 among the functions shown in FIG. 1 for supporting display of a test condition to an operator and also for supporting input of an editing period. Hard disk drive 30 is used as an external storage device and also used when data for test results obtained in other information processing system (test-object unit) is transferred to a memory 12, a storage medium 31 such as a floppy disk and a magneto-optical disk used as an external storage device and also used when data for test results obtained in other information processing system (test-object unit) is transferred to the memory 12. Line 40 such as a telephone line and LAN (Local Area Network) is used to received the data for test results obtained in other information processing system (test-object unit).

The main body 10 and the display/keyboard 20 are connected to each other through an operator interface 14, and the main body 10 and the hard disk drive 30 and the storage medium 31 each capable of direct access thereto are connected to each other through an input/output device interface 16. The main body 10 and the line 40 are connected to each other through a network interface 18.

The main body 10 comprises, as shown in FIG. 2, a MPU 11 as a center of controlling over the entire apparatus; an operator interface control section 13, an input/output device interface control section 15 and a network interface-control section 17 provided between this MPU 11 and each of interfaces 14, 16, and 18 for executing data transaction respectively; and the memory 12 for storing therein a test-program execution controlling program for realizing all the functions in FIG. 1 and also internally maintaining data therein.

The test program execution controlling program stores therein data for realizing the test program control section 1, editing period input section 2, test results editing section 3, test item scheduling section 4, test item execution table 5, and the test program 6 (it is assumed that there are ten test items).

Figure 3:
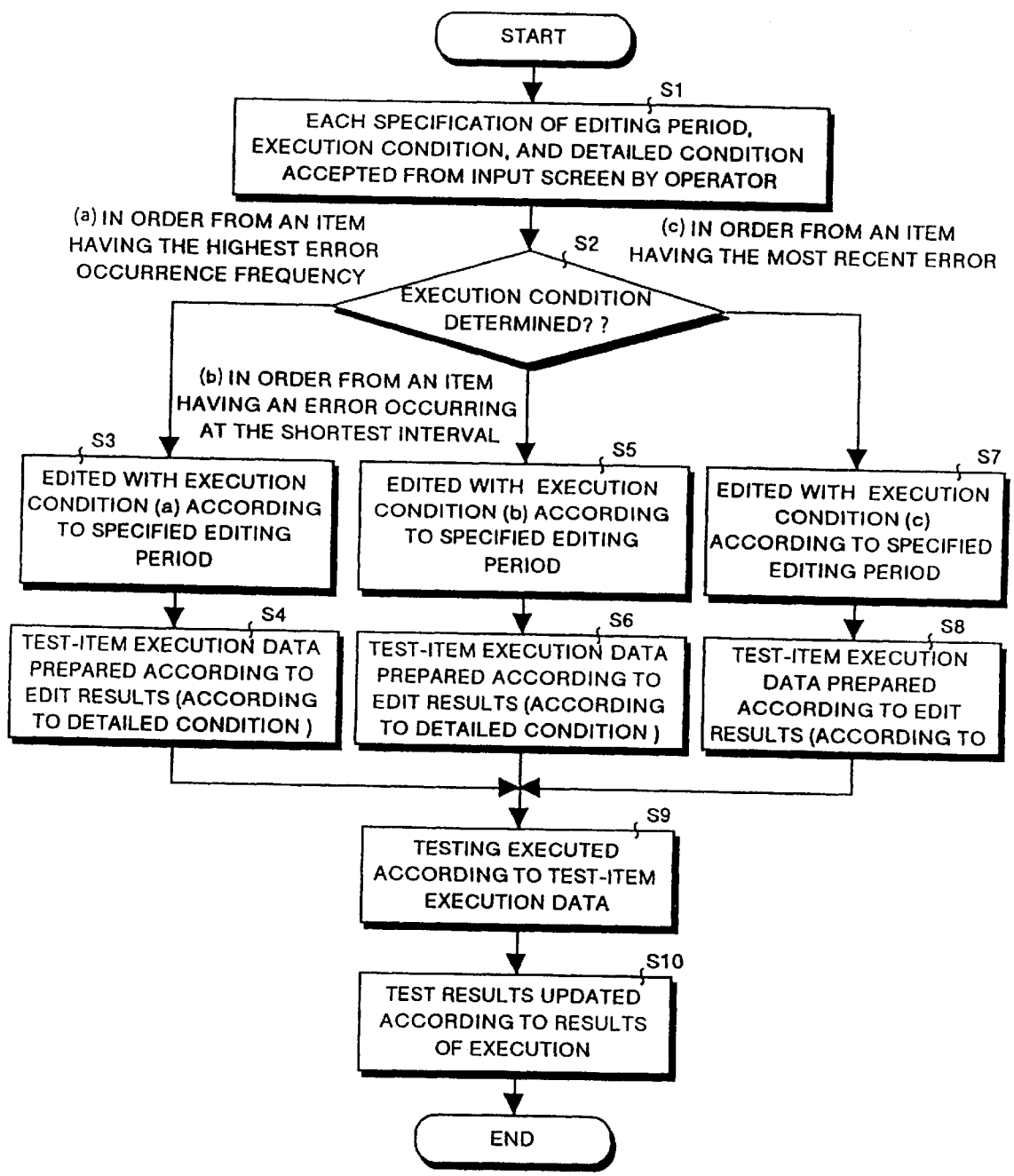
FIG. 3 is a flow chart for explaining an operation according to one embodiment of the present invention.

Description is made for operations. FIG. 3 is a flow chart for explaining operations in an embodiment of the present invention, FIG. 4 is a view showing an example of a screen for inputting editing period, FIG. 5, FIG. 11, and FIG. 13 are views each showing an example of the editing period, FIG. 6 is a view for explaining an example of test results, FIGS. 7A to 7C are views for explaining an example of edit results, FIG. 8, FIG. 9, FIG. 12, and FIG. 14 are views each for explaining an example of contents of a test-item execution table corresponding to the editing period as well as to conditions for execution control, and FIG. 10 is a view for explaining an example of updated test results.

At first, description is made for a case where the condition for execution control is "Execute from a test item corresponding to the highest frequency of occurrence of errors" with reference to FIG. 3 to FIG. 10. It should be noted that the entire operation shown in FIG. 3 is controlled by the MPU 11, and each of the operations is executed according to the configuration shown in FIG. 1. At first, an input screen for the operator formed in a specified format is displayed on a display (display/keyboard 20) for inputting an editing period and a condition for execution control, and an input from the operator is accepted (step S1).

Displayed on the input screen for an operator are, as shown in FIG. 4, a date to execute a test program (e.g. Sep. 15, 1997), a column 201 for specifying an editing period of data (for the past some years, for the past some months, from a certain month/day/year to a certain month/day/year), a column 202 for specifying a condition for executing a test (in the order from an item corresponding to the highest frequency of occurrence of error, in the order from an item corresponding to an error occurring at the shortest interval, and in the order from an item corresponding to the most recent error) and a column 203 for specifying a detailed condition (item having the frequency of XX % or less: not to be executed, item with the interval of XX days or more: not executed, and item with the date before XX days: not to be executed). It should be noted that this is an example, and it is obvious that setting of a display position of each specification column and display items or the like can arbitrarily be changed.

Selection from this display contents is prompted to the operator, and the selection is executed as shown, for example, in FIG. 5. Namely, when "in the past six months" is to be specified in the column 201 for specifying an editing period of data, the block of the past XX months is selected, "6" is inputted using a keyboard (display/keyboard 20), and the entry is accepted. Also, as the condition for execution control is "Execute from a test item corresponding to the highest error occurrence frequency", the block "in the order from an item corresponding to the highest error occurrence frequency" is specified in the column 202 for specifying an execution condition for testing. Further, if desired, when a more specific condition is to be inputted, and if the condition is that no testing is executed to an item corresponding to the frequency of 10% or less, the block "item corresponding to the frequency of 10% or less" is selected and "10" is inputted by using the keyboard (display/keyboard 20)in the column 203, and then the entry is accepted.

When the entry by the operator described above is over in step S1, at first, an execution condition for testing is determined from the contents specified in the column 201 for specifying an editing period, the column 202 for specifying an execution condition for testing and in the column 203 for specifying a detailed condition (step S2). The processing shifts to step S3 when the condition for execution control is "in the order from an item corresponding to the highest error occurrence frequency", the processing shifts to step S5 when the condition is "in the order from an item corresponding to an error occurring at the shortest interval", and the processing shifts to step S7 when the condition is "in the order from an item corresponding to the most recent error".

Because the condition for execution control "in the order from a test item corresponding to the highest error occurrence frequency" is selected, the processing shifts to step S3. In step S3, editing is executed to data for the past six months from the data for test results in the memory 12, and data for edit results is prepared. FIG. 6 shows results of program execution accumulated in the memory 12 up to date since the test program execution control apparatus is actuated in a data format as to whether errors occur or not (NG/OK) in correlation to each date for each test item. In the test item 1, for example, a test on 1995/01/12 had no error (OK), while a test on 1995/01/26 had an error (NG). The results of execution of testing for each test item for the past six months are extracted from the results of program execution of FIG. 6, and as shown in FIG. 7A, frequency of occurrence of errors for each test item is obtained as contents of editing. As for the test item 1, for example, the occurrence frequency is 16.0%. This occurrence frequency of 16.0% becomes a data for a result of editing.

When the data for edit results is prepared as described above, data for execution of testing for test items (test item execution table) in the order from a test item corresponding to the highest frequency of occurrence of errors is prepared based on the data for edit results in step S4. In this step, if no specification is made in the column 203 for specifying any detailed condition, the test item execution data with all the test items as an object for execution of testing is prepared as it is as shown in FIG. 8, but a specification that any item corresponding to the frequency of 10% or less is excluded has been made in the column 203, so that the test items 3, 7, 9 and 10 corresponding to "10% or less" are excluded from the object for execution of testing. As a result of selection, six test items are obtained as shown, for example in FIG. 9. All of these six test items have the frequency exceeding 10%.

When the test item execution data is prepared, testing of the test items is executed in the order from the header thereof depending on the order of execution of testing for the test items or on whether the testing should be executed or not according to the test item execution data, and data f or updated results shown in FIG. 10 is prepared from the results of execution of testing (step S9). The data for test results up to the previous test is updated (added) according to this data for updated results (step S10). In a case of the test item 2, for example, the testing in the previous time (1997/09/08) had no error (OK), while the testing this time (1997/09/15) had an error (NG).

Description is made for a case where the condition for execution control is "Execute in the order from a test item corresponding to an error occurring at the shortest interval" with reference to FIG. 3, FIGS. 7A to 7C, FIG. 11, and FIG. 12. When the condition for execution control "in the order from an item corresponding to an error occurring at the shortest interval" is selected as shown in FIG. 11 in the column 202 for specifying an execution condition for testing, the processing shifts to step S5 in FIG. 3. It should be noted that any other conditions are the same as those in the case of the "Execute testing from a test item corresponding to the highest error occurrence frequency". In step S5, editing is executed to the data for the past six months from the data for test results in the memory 12, and data for edit results is prepared. In this case, results of execution of testing for each test item for the past six months are extracted from the results of program execution in FIG. 6, and as shown in FIG. 7B, the shortest error interval for each test item (the error interval of 2 days or more is assumed here as an object for the shortest error interval) is obtained as contents for editing. As for the test item 1, for example, the shortest error interval is 21 days. This shortest error interval of 21 days is included in data for edit results.

When the data for edit results is prepared as described above, data for execution of testing for test items (test item execution table) in the order from a test item corresponding to an error occurring at the shortest interval is prepared based on the data for edit results in step S6. In this step, if no specification is made in the column 203 for specifying a detailed condition, the test item execution data with all the test items as an object for execution of testing is prepared as it is, but a specification that any item corresponding to the interval of 150 days or more is excluded has been made in the column 203, so that the test items 3 and 9 corresponding to "150 days ormore" are excluded from the objects for testing. As a result, six test items are obtained as shown, for example in FIG. 12. All those eight test items have the shortest error interval of less than 150 days.

When the test item execution data is prepared, testing for the test items is executed in the order from the header thereof depending on the order of execution of testing for the test items or on whether the testing should be executed or not according to the test-item execution data, and data for updated results is prepared from the results of execution of testing (step S9). After this step and on, as described above, the data for test results up to the previous test is updated (added) according to this data for updated results (step S10).

Description is made for a case where the condition for execution control is "Executed in the order from a test item corresponding to the most recent error" with reference to FIG. 3, FIGS. 7A to 7C, FIG. 13, and FIG. 14. When the condition for execution control "in the order from an item corresponding to the last error" is selected as shown in FIG. 13 in the column 202 for specifying an execution condition for testing, the processing shifts to step S7 in FIG. 3. It should be noted that any other conditions are the same as those in the case of the "Execute testing from a test item corresponding to the highest error occurrence frequency". In step S7, editing is executed to the data for the past six months from the data for test results in the memory 12, and data for edit results is prepared. In this case, results of execution of testing for each test item for the past six months are extracted from the results of program execution in FIG. 6, and as shown in FIG. 7C, the date on which an error has occurred most recently (last error date) for each test item (the date of error occurring two days before or more is assumed here as an object for the error occurring date) is obtained as contents for editing. As for the test item 1, for example, the last error date is 1997/09/08, which is two days or more earlier from the current date 15th. This last error date of 1997/09/08 is included in data for edit results.

When the data for edit results is prepared as described above, data for execution of testing for test items (test item execution table) in the order from a test item corresponding to the last error is prepared based on the data for edit results in step S8. In this step, if no specification is made in the column 203 for specifying a detailed condition, the test item execution data with all the test items as an object for execution of testing is prepared as it is, but a specification that any item corresponding to the date of error occurring 180 days or more (around six months) before is excluded has been made in the column 203, so that the test item 9 corresponding to "180 days before or more" is excluded from the objects for testing. As a result, nine test items are obtained as shown, for example in FIG. 14. All of these nine test items have the last error date of less than 180 days.

When the test item execution data is prepared, testing for the test items is executed in the order from the header thereof depending on the order of execution of testing for the test items or on whether the testing should be executed or not according to the test item execution data, and data for updated results is prepared from the results of execution of testing (step S9). After this step and on, as described above, the data for test results up to the previous test is updated (added) according to this data for updated results (step S10).

As described above, with the invention according to this embodiment, a result of testing for each test item for a test program executed to a specified information processing system is accumulated along with the test schedule, and, of the test results, an operating condition of the specified information processing system is determined according to results of testing during an arbitrary test period. Because of which, operating condition for the arbitrary test period, namely at an arbitrary point of time during the test period can be acquired for information processing system. With this feature, efficient testing appropriate for a current condition of an information processing system can be realized.

Also, a test result obtained by executing a test program for each test item to an information processing system having the same function as that of the information processing system and the test schedule are previously stored, and, of the test results, operating condition of the information processing system is determined according to test results during an arbitrary test period. Because of which, operating condition for the arbitrary test period, namely at an arbitrary point of time during the test period can be acquired in the specified information processing system with assistance of operating conditions changing in association with elapse of the operation of the information processing system having the same function as that of the specified information processing system. With this feature, without obtaining operating conditions from an information processing system as an object for testing, efficient testing appropriate for a current condition of the information processing system can be realized.

An arbitrary test period is specified when an operating condition is to be determined, so that the operating condition during a certain period of the test period can be obtained.

An order of testing of the test items is decided based on the operating conditions within an arbitrary test period, so that the order of execution is not fixed previously, and the best order of testing for the current condition of the information processing system can be acquired.

The order of testing of the test items includes an order of execution and whether testing is to be performed or not, so that the order of testing and an object for execution are not fixed, and the best order of testing as well as object for execution according to a current condition of the information processing system can be acquired.

Conditions in which errors occur for each test item are determined, and an order of testing the test items is decided in a descending order from a test item corresponding to the highest frequency of occurrence of errors based on the conditions of occurrence of errors for each test item, so that testing from a test item having higher probability of detecting errors can efficiently be executed in the current information processing system.

Conditions in which errors occur for each test item are determined, and an order of testing of the test items is decided in an ascending order from a test item corresponding to an error occurring at the shortest interval based on the condition of occurrence of errors for each test item, so that testing from a test item in which an error occurs easily can efficiently be realized.

Conditions in which errors occur for each test item are determined, and an order of testing of the test items is decided in an ascending order from a test item corresponding to the most recent error based on the condition of occurrence of errors for each test item, so that it is possible to first check whether appropriate countermeasures have been taken for the error or not.

Conditions in which errors occur for each test item are determined, and a test item having a lower value of error occurrence frequency than a preset value is excluded from objects for execution based on the condition of occurrence of errors for each test item, so that testing can efficiently be executed within a shorter period of time without reducing test the effect of the test substantially.

Execution of a test program is controlled according to an order of testing of the test items, so that testing can efficiently executed because test items that need not be tested are excluded from the testing.

In addition, by executing each test item for a number of times corresponding to a frequency of occurrence of errors, effective testing focusing on a critical function can be executed within a limited period of time. As shown in FIG. 15, for example, a larger number of execution times is set for a test item having a higher frequency of occurrence of errors, so that errors can be detected easily. Also, as shown in FIG. 16, by setting a number of execution times of a test item in which a frequency of occurrence of errors is a specified value or less than zero, time required for testing can also be reduced considerably. It should be noted that, in FIG. 15 and FIG. 16, testing for test items in the order from a test item corresponding to the highest error occurrence frequency is executed for a specified number of times, but testing for each test item may be executed by a number of times decided randomly.

Although the invention has been described with respect to a specific embodiment for a clear and a complete disclosure, the applied claims are not thus limited to the embodiment described above, and are to be construed as embodying all modifications and alternative constructions that may occur to one skilled in the art which fairly fall within the basic teaching herein set forth.

As described above, in the invention, a result of testing for each test item for a test program executed for a specified information processing system is accumulated along with the test schedule, and, of the test results, operating conditions of the information processing system are determined based on the results of testing during only an arbitrary test period. Because of which, operating conditions for the arbitrary test period, namely at an arbitrary point of time during the test period can be acquired for the information processing system, and with this feature, it is possible to obtain a test program execution control apparatus in which efficient testing appropriate for a current condition of the information processing system can be realized.

With the invention, a number of times the testing for each test item is to be executed is determined according to a frequency of occurrence of errors, so that it is possible to obtain a test program execution control apparatus in which effective testing focusing on a critical function can be realized within a limited period of time.

With the invention, a condition in which an error occurs for each test item is determined, and an order of execution is decided in an order from a test item corresponding to the highest frequency of occurrence of errors to a test item corresponding to the lowest frequency of occurrence of errors according to the condition of occurrence of errors for each test item so that it is possible to obtain a test program execution control apparatus in which testing of a test item having higher probability of detecting an error can efficiently be executed in the current information processing system.

With the invention, a condition in which an error occurs for each test item is determined as an, and an order of execution is decided in an order from a test item in which error occurs at a shortest interval to a test item in which error occurs at a longest interval according to the condition of occurrence of errors for each test item, so that it is possible to obtain a test program execution control apparatus in which testing from a test item in which an error easily occurs can efficiently be realized.

With the invention, a condition in which an error occurs for each test item is determined as an operating condition, and an order of execution is decided in an order from a test item in which an error has occurred most recently to a test item in which an error has occurred most lately according to the condition of occurrence of errors for each test item, so that it is possible to obtain a test program execution control apparatus which can first recognize that the error having occurred is accurately dealt with.

With the invention, a condition in which an error occurs for each test item is determined, and a test item having a lower value of error occurrence frequency than a preset value is excluded from objects for execution according to the condition of occurrence of errors for each test item, so that it is possible to obtain a test program execution control apparatus in which testing can efficiently be executed within a shorter period without reducing the effect of the test substantially.

With the invention, a condition in which an error occurs for each test item is determined, and an order of execution is decided in a descending order from a test item corresponding to the highest error occurrence frequency or in an ascending order from a test item corresponding to an error occurring at the shortest interval, or in an ascending order from a test item corresponding to the last error according to the condition of occurrence of errors for each test item, so that it is possible to obtain a test program execution control apparatus in which testing from a test item having higher probability of detecting errors can efficiently be executed when attention is paid to test items having a higher frequency of occurrence of errors, or testing from a test item having higher probability of occurrence of errors when attention is paid to test items corresponding to an error occurring at a short interval, and checking whether countermeasures have been taken or not when attention is paid to the most recent occurrence of error becomes possible.

With the invention, there are provided steps of accumulating a result of testing for each test item for a test program executed for a specified information processing system along with the test schedule in the memory, specifying an arbitrary test period within the test schedule for each test item accumulated in the memory, determining an operating condition of the information processing system based on the results of testing during the arbitrary test period, and deciding an order of execution of testing for each test item for the test program according to the determined operating condition, so that an operating condition for the arbitrary test period, namely at an arbitrary point time during the test period can be acquired for the information processing system, and with this feature, it is possible to obtain a test program execution controlling method in which efficient testing appropriate for a current condition of the information processing system can be realized.

With the invention, there are provided steps of determining the conditions in which an error occurs for each test item, and deciding an order of execution in a descending order from a test item corresponding to the highest error occurrence frequency or in an ascending order from a test item corresponding to an error occurring at the shortest interval or in an ascending order from a test item corresponding to the last error according to the condition of occurrence of errors for each test item, so that it is possible to obtain a test program execution controlling method in which testing can efficiently be started from a test item having higher probability of detecting errors when attention is paid to the test item having a higher frequency of occurrence of errors, or testing from a test item having higher probability of occurrence of error when attention is paid to the test item corresponding to an error occurring at a short interval, and checking whether countermeasures have been taken when attention is paid to the most recent occurrence of an error becomes possible.

With the invention, there are provided steps of determining of the condition in which an error occurs for each test item, and excluding a test item having a lower value of error occurrence frequency than a preset value from objects for execution, so that it is possible to obtain a test program execution controlling method in which testing can efficiently be executed within a shorter period without substantially lowering the effect of the test.

With the invention, there are provided steps of determining the conditions in which an error occurs for each test item, and deciding an order of execution of testing in a descending order from a test item corresponding to the highest error occurrence frequency, or in an ascending order from a test item corresponding to an error occurring at the shortest interval, or in an ascending order from a test item corresponding to the last error according to the condition of occurrence of errors for each test item, so that it is possible to obtain a test program execution controlling method in which testing can efficiently be started from a test item having a higher probability of detecting errors when attention is paid to test item having a higher frequency of occurrence of errors, or testing from a test item having a higher probability of occurrence of error when attention is paid to the test item corresponding to an error occurring at a short interval, and checking whether countermeasures have been taken or not when attention i s paid to the most recent occurrence of error becomes possible.

With the invention, a number of executions of testing for each test item is set according to the error occurrence frequency, so that it is possible to obtain a test program execution controlling method in which effective testing focusing on a critical function can be realized within a limited period of time.

With the invention, there is provided a recording medium in which it is recorded a method having steps of accumulating a test result for each test item for a test program executed for a specified information processing system in the along with the test schedule in a memory, specifying an arbitrary test period within the test schedule for each test item accumulated in the memory, determining operating condition of the information processing system based on the results of testing during the arbitrary test period, and deciding an order of execution of testing for test items for the test program according to the determined operating condition, so that a function of acquiring an operating condition for the arbitrary test period, namely at an arbitrary point of time during the test period can be acquired for the specified information processing system for the test program execution control apparatus, and with this feature, it is possible to obtain a computer-readable recording medium in which efficient testing appropriate for a current condition of an information processing system can be realized.

With the invention, there is provided a recording medium in which it is recorded a method having steps of determining of the condition in which an error occurs for each test item, and deciding an order of execution of testing in a descending order from a test item corresponding to the highest error occurrence frequency, or in an ascending order form a test item corresponding to an error occurring at the shortest interval, or in an ascending order form a test item corresponding to the last error according to the condition of occurrence of errors for each test item, so that it is possible to obtain a computer-readable recording medium in which testing can efficiently be started from a test item having higher probability of detecting errors in an information processing system when attention is paid to test item having a higher frequency of occurrence of errors, or testing from a test item having higher probability of occurrence of error when attention is paid to test item corresponding to an error occurring at a short interval, and checking whether countermeasures have been taken or not when attention is paid to the most recent occurrence error becomes possible.

With the invention, there is provided a recording medium in which it is recorded a method having steps of determining of the condition in which an error occurs for each test item, and excluding a test item having a lower value of error occurrence frequency than a preset value from objects for execution according to the condition of occurrence of errors for each test item, so that it is possible to obtain a computer-readable recording medium in which testing can efficiently be executed within a shorter period without substantially reducing effect of the test.

This application is based on Japanese patent application No. HEI 10-113767 filed in the Japanese Patent Office on Apr. 23, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A test program execution control apparatus for controlling execution of a test program for a specified information processing system comprising:

an accumulating unit for accumulating therein a result of testing for each test item for a test program executed for said specified information processing system along with a test schedule;

an operating condition determining unit for determining operating condition of said specified information processing system based on the result of testing during an arbitrary test period accumulated in said accumulating unit; and a deciding unit for deciding an order of execution of testing for each test item for said test program based on the operating condition determined by said operating condition determining unit.

2. A test program execution control apparatus according to claim 1; wherein testing for each of the test items is executed by a number of times corresponding to the frequency of occurrence of errors for that test item.

3. A test program execution control apparatus according to claim 1; wherein said operating condition determining unit determines the conditions in which errors occur for each test item, and said deciding unit decides an order of execution in a descending order from a test item corresponding to the highest frequency of occurrence of errors based on the condition of occurrence of errors for each test item.

4. A test program execution control apparatus according to claim 1; wherein said operating condition determining unit determines the conditions in which errors occur for each test item, and said deciding unit decides an order of execution of the test items in an ascending order from a test item corresponding to an error occurring at the shortest interval based on the condition of occurrence of errors for each test item.

5. A test program execution control apparatus according to claim 1; wherein said operating condition determining unit determines the conditions in which errors occur for each test item, and said deciding unit decides an order of execution of the test item in an ascending order from a test item corresponding to the last error based on the condition of occurrence of errors for each test item.

6. A test program execution control apparatus according to claim 1; wherein said operating condition determining unit determines the conditions in which errors occur for each test item, and said deciding unit excludes a test item having a lower value of error occurrence frequency than a preset value from the objects for testing based on the condition of occurrence of errors for each test item.

7. A test program execution control apparatus according to claim 1; wherein said operating condition determining unit determines the conditions in which errors occur for each test item, and said deciding unit decides an order of execution of the test item in any one of a) descending order from any one test item of a test item corresponding to the highest error occurrence frequency, b) ascending order from a test item corresponding to an error occurring at the shortest interval and c) ascending order from a test item corresponding to the most recent error based on the condition of occurrence of errors for each test item.

8. A test program execution controlling method for controlling execution of a test program for a specified information processing system comprising:

a first step of accumulating a result of testing for each test item for a test program executed for said information processing system along with a test schedule in a memory;

a second step of specifying an arbitrary test period within the test schedule for which the test results have been accumulated in said memory in the first step;

a third step of determining the operating condition of said information processing system based on a test result during the arbitrary test period specified in the second step; and a fourth step of deciding an order of execution of testing for each test item for said test program based on the operating condition determined in the third step.

9. A test program execution controlling method according to claim 8; wherein the conditions in which errors occur for each test item are determined in the third step, and an order of execution of the test items is decided in the fourth step in any one of a) descending order from any one test item of a test item corresponding to the highest error occurrence frequency, b) ascending order from a test item corresponding to an error occurring at the shortest interval and c) ascending order from a test item corresponding to the most recent error based on the condition of occurrence of errors for each test item.

10. A test program execution controlling method according to claim 8; wherein the conditions in which errors occur for each test item are determined in the third step, and a test item having a lower value of error occurrence frequency than a preset value is excluded in the fourth step from the objects for execution.

11. The test program execution controlling method according to claim 8; wherein the condition in which errors occur for each test item is determined in the second step, and an order of execution is decided in the third step in any one of a) descending order from any one test item of a test item corresponding to the highest error occurrence frequency, b) ascending order from a test item corresponding to an error occurring at the shortest interval and c) ascending order from a test item corresponding to the most recent error based on the condition of occurrence of errors for each test item.

12. A test program execution controlling method according to claim 8; wherein a number of times of testing for each test item is set based on an error occurrence frequency.

13. A computer-readable recording medium with a program for making a computer execute a test program execution controlling method applied to a test program execution control apparatus for controlling execution of a test program for a information processing system recorded therein, said method comprising:

a first step of accumulating a test result for each test item for a test program executed to said specified information processing system along with a test schedule in a memory;

a second step of specifying an arbitrary test period within the test schedule for which the test results have been accumulated in said memory in the first step;

a third step of determining the operating condition of said information processing system based on the test result during the arbitrary test period specified in the second step; and a fourth step of deciding an order of execution of testing for test items for the test program based on the operating condition determined in the third step.

14. A computer-readable recording medium according to claim 13; wherein the condition in which errors occur for each test item is determined in the third step as, and an order of execution of the test item is decided in the fourth step in any one of a) descending order from any one test item of a test item corresponding to the highest error occurrence frequency, b) ascending order from a test item corresponding to an error occurring at the shortest interval and c) ascending order from a test item corresponding to the most recent error based on the condition of occurrence of errors for each test item.

15. A computer-readable recording medium according to claim 13; wherein the conditions in which errors for each test item are determined in the third step, and a test item having a lower value of error occurrence frequency than a preset value is excluded in the fourth step from the objects for execution based on the condition of occurrence of errors for each test item.

* * * * *